(12) United States Patent
McKinnon et al.

(10) Patent No.: US 6,952,100 B1
(45) Date of Patent: Oct. 4, 2005

(54) PHASE CONTROLLED SURFACE COIL MAGNETIC RESONANCE IMAGING

(75) Inventors: Graeme C. McKinnon, Hartland, WI (US); Eddy B. Boskamp, Menomonee Falls, WI (US); Shumin Wang, Lima, OH (US)

(73) Assignee: GE Medical Systems Global Technology, Inc., Waukesha, WI (US)

( * ) Notice: Subject to any disclaimer, the term of this patent is extended or adjusted under 35 U.S.C. 154(b) by 0 days.

(21) Appl. No.: 10/709,354

(22) Filed: Apr. 29, 2004

(51) Int. Cl.[7] .............................................. G01V 3/00
(52) U.S. Cl. .................................... 324/318; 324/309
(58) Field of Search ............................... 324/318, 319, 324/322, 309, 307, 300; 600/410

(56) References Cited

U.S. PATENT DOCUMENTS

| | | | | |
|---|---|---|---|---|
| 4,300,096 A | * | 11/1981 | Harrison et al. | ............ 324/309 |
| 4,685,468 A | * | 8/1987 | Macovski | ................... 600/410 |
| 4,899,109 A | * | 2/1990 | Tropp et al. | ................ 324/320 |
| 5,153,517 A | * | 10/1992 | Oppelt et al. | ............... 324/322 |
| 5,614,826 A | * | 3/1997 | Dixon | ........................ 324/307 |
| 6,400,154 B2 | | 6/2002 | Tomanek et al. | |
| 6,518,757 B1 | * | 2/2003 | Speier | ........................ 324/303 |
| 6,552,541 B2 | * | 4/2003 | Nauerth | ..................... 324/309 |
| 2004/0193038 A1 | * | 9/2004 | Reykowski et al. | ........ 600/410 |

* cited by examiner

*Primary Examiner*—Brij B. Shrivastav
(74) *Attorney, Agent, or Firm*—Michael DellaPenna; Artz & Artz, P.C.

(57) ABSTRACT

A magnetic resonance imaging assembly is provided. The assembly includes a magnet assembly defining a scanning bore along a z-direction. The assembly further includes a surface coil assembly positioned within the scanning bore. The surface coil assembly receives an imaging field. The surface coil assembly comprises a first surface coil positioned along the z-direction. The first surface coil is induced with a first coil current comprised of a first coil amplitude and a first coil phase. The surface coil assembly includes a second surface coil positioned along said z-direction. The second surface coil is induced with a second coil current comprised of a second coil amplitude and a second coil phase. The second coil phase is varied from the first coil phase to correct asymmetries within the imaging field.

20 Claims, 3 Drawing Sheets

PHASE CONTROLLED SURFACE COIL MAGNETIC RESONANCE IMAGING

BACKGROUND OF INVENTION

The present invention relates generally to a magnetic resonance imaging method and assembly, and, more particularly to a magnetic resonance imaging assembly with a phase controlled surface coil for image correction.

Magnetic Resonance Imaging (MRI) is a well-known medical procedure for obtaining detailed, one, two and three-dimensional images of patients, using the methodology of nuclear magnetic resonance (NMR). MRI is well suited to the visualization of soft tissues and is primarily used for diagnosing disease pathologies and internal injuries.

Typical MRI systems include a super conducting magnet capable of producing a strong, homogenous magnetic field around a patient or portion of the patient; a radio frequency (RF) transmitter and receiver system, including transmitter and receiver coils, also surrounding or impinging upon a portion of the patient; a gradient coil system also surrounding a portion of the patient; and a computer processing/imaging system, receiving the signals from the receiver coil and processing the signals into interpretable data, such as visual images.

MRI systems additionally can utilize surface coils for imaging. Surface coil assemblies are utilized to produce localized magnetic fields to assist in imaging. Often, however, the use of surface coil imaging can result in a left right shading artifact in axial images. This artifact is commonly referred to as a local intensity shift artifact (LISA). At lower field intensities such as 1.5 T (Tesla) the artifacts produced by existing technologies may be barely noticeable. At higher field strengths (3T and above for example) the artifacts may impose significant image quality issues.

The origin of these artifacts stems from an inaccurate assumption regarding the nature of the surface coils. It is often generally assumed that a surface coil produces a linearly polarized magnetic field. However, this may only be the case if the phase shift for the propagation of magnetic energy is everywhere the same from all points on the surface coil to a given point in the region to be imaged. For low frequencies this may be a reasonable approximation, but at higher frequencies this type of assumption begins to break down. Artifacts are further compounded when imaging large water filled objects (such as human subjects). This is a result of the relative dielectric constant than increases about 80 times over that of air. In addition, there are also RF eddy currents induced in the conducting object, which further influences the field.

Surface coils are commonly formed as loops defining a central axis perpendicular to the surface subtended by the loop and traveling through the center of the loop. For MR imaging this axis is commonly orientated perpendicular to the z-axis. The z-axis is taken in the direction of the main magnet field. For MR imaging, it is only the x and y components of the RF coil's magnetic field that are involved in the imaging process. Any variations in design or phase of the various coil segments can result in the x and y components of the magnetization becoming out of phase with each other, depending on their particular location with respect to the coil. The resultant phase difference is typically anti-symmetric with respect to the central axis of the surface coil and can cause the otherwise linear polarization to become elliptically polarized. The direction of the elliptical polarization is different on opposite sides of the central axis of the surface coil.

An elliptical polarized field can be represented by two counter rotating circular polarized fields of differing amplitudes. Because of the different rotation directions, on one side of the central axis the clockwise component is larger than the counter-clockwise component. On the flip-side the reverse is true. In MR imaging it is only one of the circular polarized components of the B1 field that contributes. Therefore, because of the different strengths of the rotating components, there arises asymmetry in the sensitivity of the coil to the MR signal. In practice, therefore, imaging of subjects such as axial images of the spinal region can result in one side of the image becoming brighter than the other.

It would, however, be highly desirable to have a magnetic resonance imaging method and assembly wherein local intensity shift artifact is reduced even under high field strengths. Similarly, it would be highly desirable to have a magnetic resonance imaging method and assembly with controlled reduction in surface coil phase shift to reduce elliptical polarization of the resultant image.

SUMMARY OF INVENTION

A magnetic resonance imaging assembly is provided. The assembly includes a magnet assembly defining a scanning bore along a z-direction. The assembly further includes a surface coil assembly positioned within the scanning bore. The surface coil assembly receives an imaging field. The surface coil assembly comprises a first surface coil positioned along the z-direction. The first surface coil is induced with a first coil current comprised of a first coil amplitude and a first coil phase. The surface coil assembly includes a second surface coil positioned along said z-direction. The second surface coil is induced with a second coil current comprised of a second coil amplitude and a second coil phase. The second coil phase is varied from the first coil phase to correct asymmetries within the imaging field.

Other features of the present invention will become apparent when viewed in light of the detailed description of the preferred embodiment when taken in conjunction with the attached drawings and appended claims.

DETAILED DESCRIPTION

Figure 1:
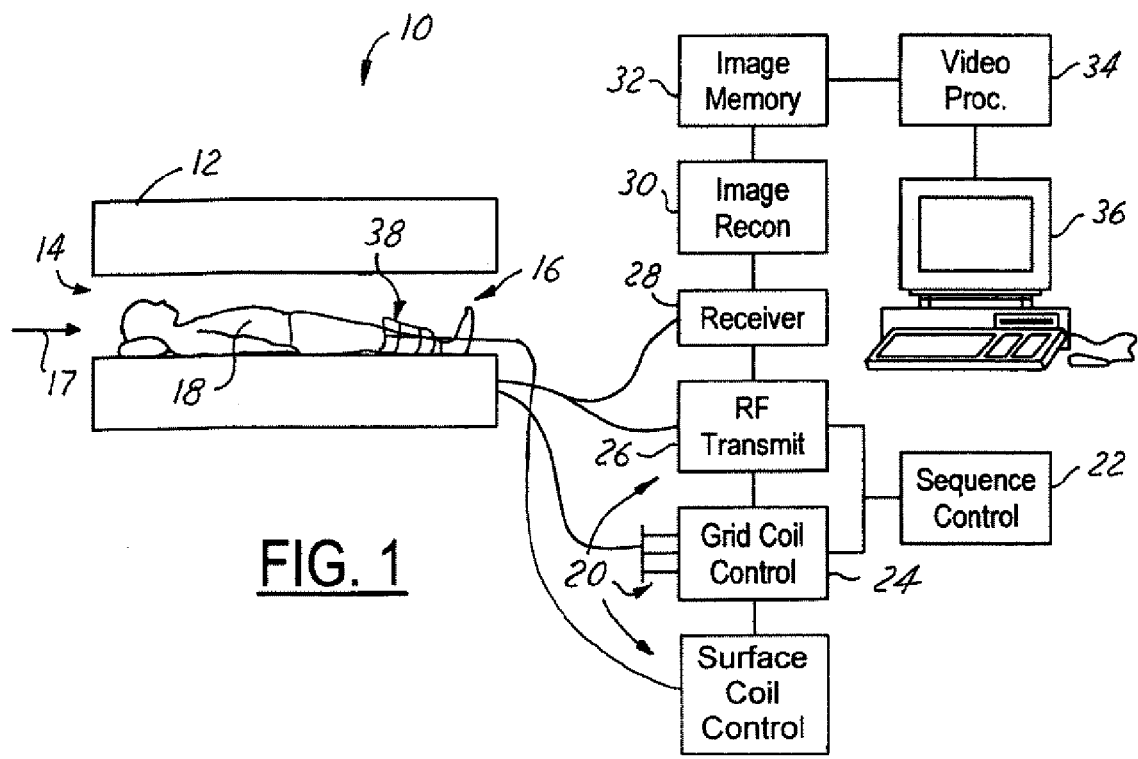
FIG. 1 is OLE_LINK1a magnetic resonance imaging assembly in accordance with the present inventionOLE_LINK1.

Referring now to FIG. 1, which is an illustration of a magnetic resonance assembly 10 in accordance with the present invention. Although a specific magnetic resonance assembly 10 is illustrated, it should be understood that the present invention is contemplated to be useful in a wide variety of magnetic resonance assemblies. The magnetic resonance imaging assembly 10 includes a superconducting magnet coil 12 positioned within a substantially cylindrical structure 14 defining a scanning bore 16 along a z-direction 17. An imaging object 18, such as a patient, is placed within the scanning bore 16. A series of coil controllers 20 in communication with a sequence controller 22 provide the assembly 10 with flexible control of the resonance assembly 10 functions. These coil controllers 20, such as a gradient coil controller 24 and a RF controller 26, produce changes in the magnetic field generated by the superconducting magnet coil 12. These changes are monitored by a receiver 28 which in turn is in communication with an image reconstructor 30. The image reconstructor 30 develops the data from the receiver 28 into a digital image which can be stored in image memory 32 and displayed on a video device 34. This allows the magnetic resonance assembly 10 to be utilized as a functional diagnostic device. A control station 36 allows a user to monitor and control operation of the magnetic resonance assembly 10.

Figure 2:
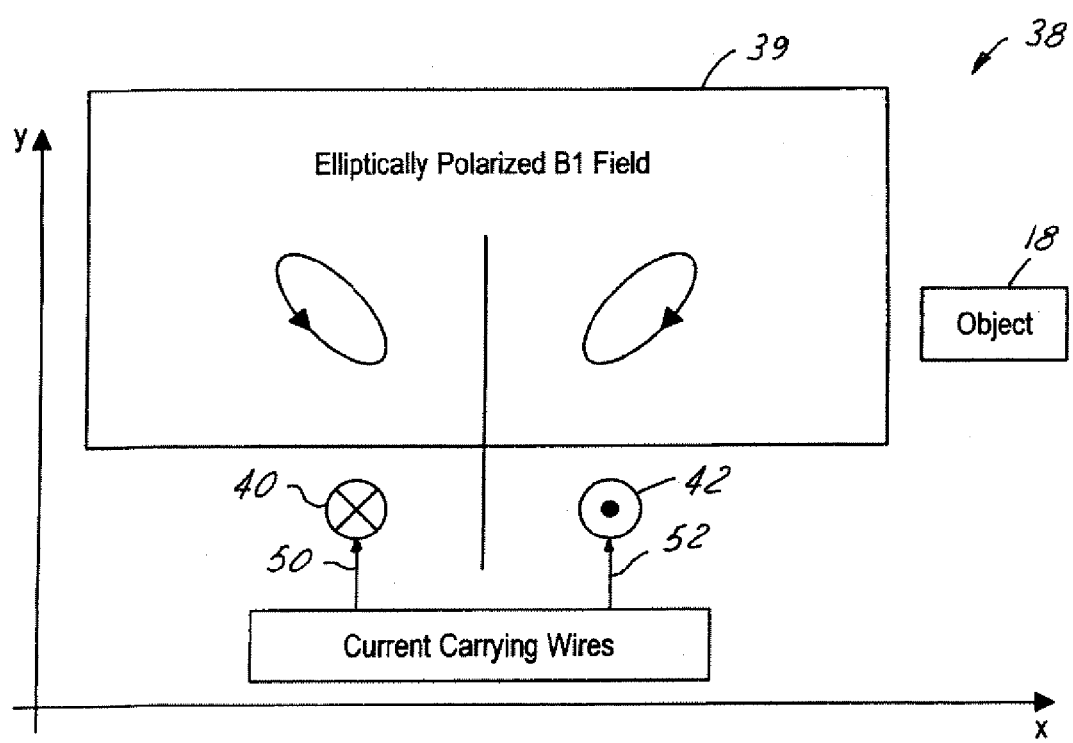
FIG. 2 is a representation of the origins of non-homogeneous magnetic fields within the magnetic resonance imaging assembly illustrated in FIG. 1.
Figure 3:
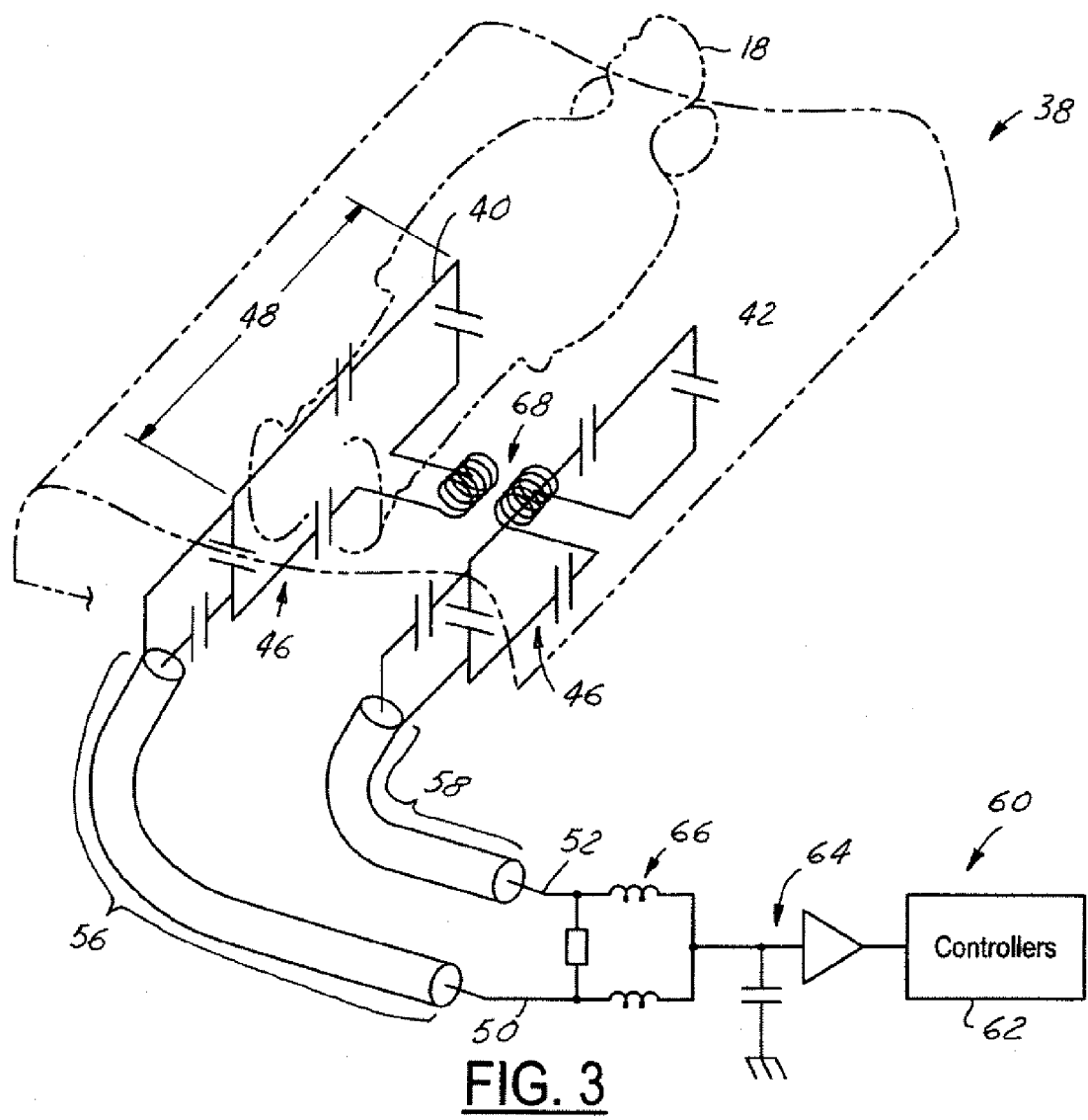
FIG. 3 is an illustration of a surface coil assembly for use in the magnetic resonance imaging assembly illustrated in FIG. 1.

It is known that in surface coil assemblies 38 may be utilized to receive localized magnetic fields (see FIG. 3). The surface coil assembly 38 is placed within the scanning bore 16 during operation and commonly is placed directly around a portion of the imaging object 18. The surface coil assembly 38 is utilized to receive an imaging field 39 around the portion of the patient 18. The surface coil assembly 38 is comprised of a first surface coil 40 and a second surface coil 42, both orientated along the z-axis 17. Although the term coil is utilized, it should be understood that the first and second surface coils 40,42 are intended to encompass a range of physical embodiments from rod-shaped elements 44 (see FIG. 2) to rectangular loop coils 46 (see FIG. 3) with an extended length dimension 48 along the z-direction 17.

Surface coil assemblies 38 run the operational risk of developing imaging fields 39 that can become elliptically polarized such as the elliptically polarized B1 field illustrated in FIG. 2. This, in turn, can result in the development of undesirable localized intensity shift artifacts. The present invention addresses this prior concern by controlling a first coil current 50, induced in the first surface coil 40 by the imaging field 39, having a first coil amplitude and a first coil phase. A second coil current 52, induced in the second surface coil 42 by the imaging field 39, having a second coil amplitude and a second coil phase is controlled as well. The present invention varies the characteristics of the first coil current 50 from the characteristics of the second coil current 52 in order to correct the elliptical polarization of the imaging field 39. It is contemplated that this corrective variation may be accomplished by way of varying the first and second coil phases from one another, varying the amplitudes, or a combination of the above. Although the present invention primarily contemplates the adjustment of current induced in the surface coils 40,42, it additionally contemplates supplying the surface coils 40,42 with transmitted currents.

Figure 4:
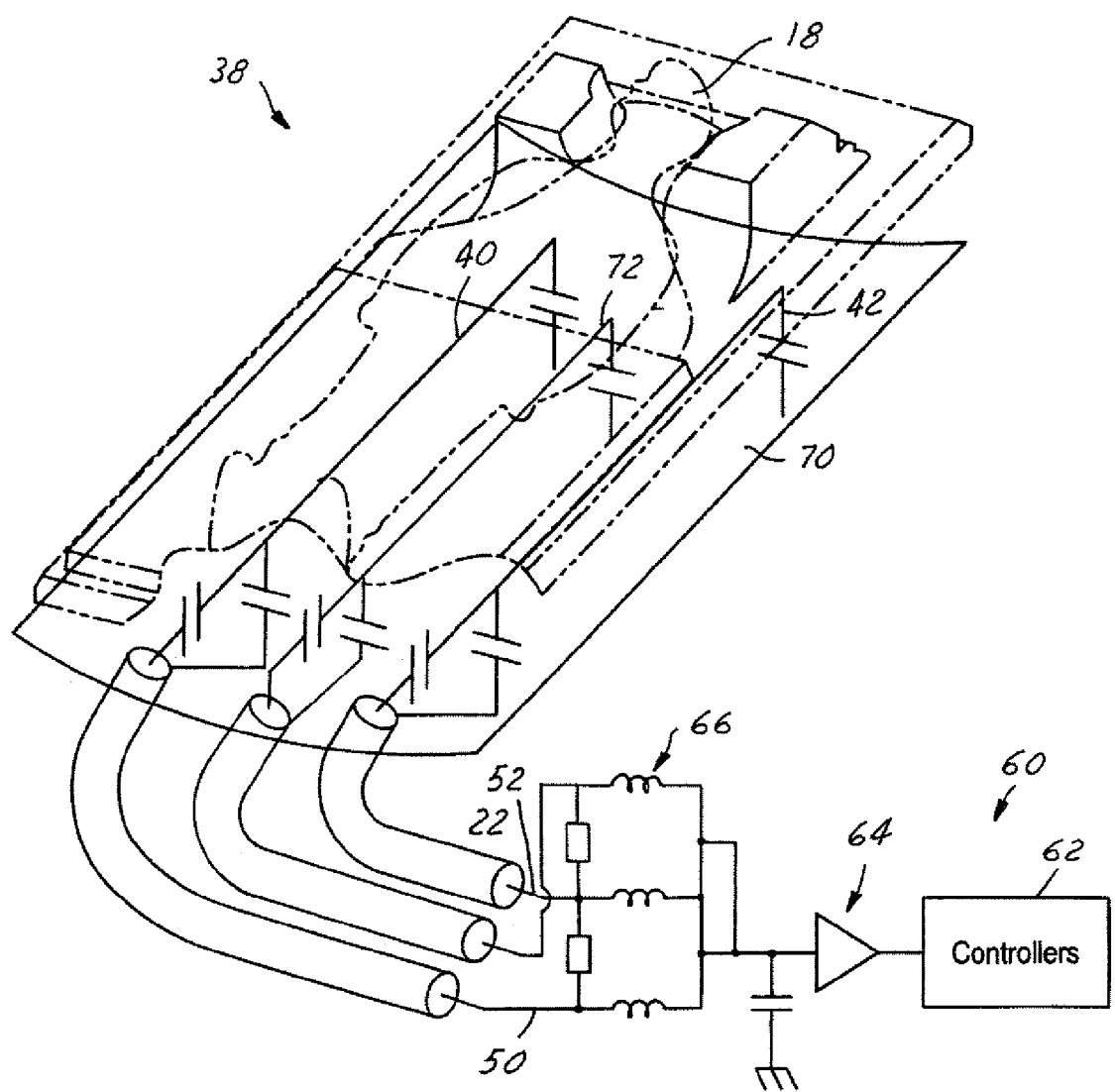
FIG. 4 is an illustration of an alternate embodiment of a surface coil assembly for use in the magnetic resonance imaging assembly illustrated in FIG. 3.

It is contemplated that the characteristics of the first and second coil currents 50,52 may be controlled in a variety of fashions. Simple solutions such as varying the current path length such that the first coil current 50 has a longer (or shorter) first current path length 56 than the second current path length 58. The current path length may also be varied using adjustable components during operation. In advanced embodiments, a control system 60 may be placed in communication with the first and second surface coils 40 such that advanced control of the first and second coil current 50,52 characteristics may be achieved. Although a variety of control systems 60 may be utilized, one embodiment contemplates the use of a controller 62 with internal logic in communication with a pre-amplifier 64 to adjust current characteristics to the coils 40,42. A phase-shifting network 66 may be further utilized to simplify relative adjustment of current phase between the coils 40,42. In addition, a decoupling circuit 68 may be positioned between the two coils 40,42 to further improve independent phase and amplitude control. A ground plane element 70 (see FIG. 4) may be placed in communication with both coils 40,42 to allow a single grounding while the current and amplitudes may still be controlled independently using the control system 60. It is contemplated that the controller 62 can include logic to allow manual correction and adjustment of the imaging field 39 or may include logic to automatically monitor and adjust the imaging field 39 for best results.

Figure 5A:
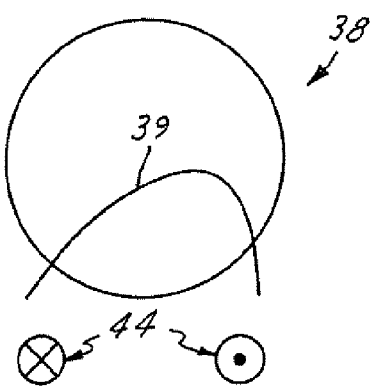
FIG. 5a is a detailed illustration of the imaging field generated by the surface coil assembly illustrated in FIG. 3, the imaging field shown without phase correction.
Figure 5B:
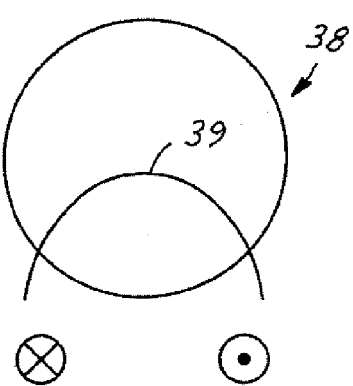
FIG. 5b is a detailed illustration of the imaging field generated by the surface coil assembly illustrated in FIG. 3, the imaging field shown with phase correction.

The present invention operates by varying the phase and/or amplitude of the currents 50,52 to correct the imaging field 39. FIG. 2 illustrates the imaging field 39 as elliptically polarized prior to the corrective currents 50,52 having been sent to the coils 40,42. A simplistic rendition of the effect of this elliptical polarization is illustrated in FIG. 5a. By varying the current characteristics of the two coils 40,42 the imaging field 39 can be corrected or at a minimum the asymmetrical characteristics can be re-moved (see FIG. 5b). It should understood that any number of additional coils 72 may be used in combination with the first and second coils 40,42 under the operation principles of the present invention. Furthermore, it is contemplated that the control system 60 may be programmed to provide a vast array of current adjustments to fine tune the imaging field 39.

While particular embodiments of the invention have been shown and described, numerous variations and alternative embodiments will occur to those skilled in the art. Accordingly, it is intended that the invention be limited only in terms of the appended claims.

What is claimed is:

1. A magnetic resonance imaging assembly comprising:
   a magnet assembly defining a scanning bore along a z-direction;
   a surface coil assembly positioned within said scanning bore, said surface coil assembly receiving an imaging field, said surface coil assembly comprising:
   a first surface coil positioned along said z-direction, said first surface coil induced with a first coil current comprised of a first coil amplitude and a first coil phase; and
   a second surface coil positioned along said z-direction, said second surface coil induced with a second coil current comprised of a second coil amplitude and a second coil phase, said second coil phase varied from said first coil phase to correct asymmetries with said imaging field.

2. A magnetic resonance imaging assembly as described in claim 1, wherein said first surface coil comprises:
   a rectangular loop coil having an extended length dimension, said extended length dimension aligned along said z-direction.

3. A magnetic resonance imaging assembly as described in claim 1, wherein said first surface coil and said second surface coil comprise conductive rods.

4. A magnetic resonance imaging assembly as described in claim 1, further comprising:
a ground plane element, said first surface coil and said second surface coil in electrical communication with said ground plane element.

5. A magnetic resonance imaging assembly as described in claim 1, further comprising:
a phase shifting network in communication with said first surface coil and said second surface coil, said phase shifting network varying said second coil phase from said first coil phase.

6. A magnetic resonance imaging assembly as described in claim 5, wherein said phase shifting network further varies said second coil amplitude from said first coil amplitude.

7. A magnetic resonance imaging assembly as described in claim 1, wherein said second coil amplitude is varied from said first coil amplitude such to correct elliptical polarization of said imaging field.

8. A magnetic resonance imaging assembly as described in claim 1, wherein said surface coil assembly further comprises:
a third surface coil positioned along said z-direction, said third surface coil supplied with a third coil current comprised of a third coil amplitude and a third coil phase.

9. A magnetic resonance imaging assembly as described in claim 1, wherein said surface coil assembly further comprises:
a decoupling circuit positioned in communication with both said first surface coil and said second surface coil.

10. A magnetic resonance imaging assembly as described in claim 1, further comprising:
a controller in communication with said first surface coil and said second surface coil; and
a pre-amplifier positioned in communication with said first surface coil and said second surface coil.

11. A magnetic resonance imaging assembly as described in claim 1, wherein said second coil phase is varied by varying the current path length of said second coil current.

12. A magnetic resonance imaging assembly comprising:
a magnet assembly defining a scanning bore;
a surface coil assembly positioned within said scanning bore, said surface coil assembly receiving an imaging field, said surface coil assembly comprising:
a first surface coil, said first surface coil induced with a first coil current comprised of a first coil amplitude and a first coil phase; and
a second surface coil, said second surface coil induced with a second coil current comprised of a second coil amplitude and a second coil phase;
a controller in communication with said surface coil assembly, said controller including logic adapted to vary said second coil phase and said first coil phase independently to correct said imaging field.

13. A magnetic resonance imaging assembly as described in claim 12, further comprising:
a ground plane element, said first surface coil and said second surface coil in electrical communication with said ground plane element.

14. A magnetic resonance imaging assembly as described in claim 12, further comprising:
a phase shifting network in communication with said first surface coil and said second surface coil, said phase shifting network varying said second coil phase from said first coil phase.

15. A magnetic resonance imaging assembly as described in claim 12, wherein said logic is adapted to vary said second coil amplitude and said first coil amplitude independently to correct said imaging field.

16. A magnetic resonance imaging assembly as described in claim 12, wherein said surface coil assembly further comprises:
a decoupling circuit positioned in communication with both said first surface coil and said second surface coil.

17. A method of producing a magnetic resonance image comprising:
placing a subject within a subject gap of a magnetic assembly;
placing a surface coil assembly within said subject gap, said surface coil assembly comprising a first surface coil and a second surface coil;
receiving an imaging field using said surface coil assembly;
controlling a first coil current induced in said first surface coil, said first coil current comprised of a first coil amplitude and a first coil phase;
controlling a second coil current induced in said second surface coil, said second current comprised of a second coil amplitude and a second coil phase;
adjusting said second coil current and said first coil current to reduce phase-shift in said imaging field.

18. A method as described in claim 17, further comprising:
supplying a first coil current to in said first surface coil, said first coil current comprised of a first coil amplitude and a first coil phase;
supplying a second coil current to said second surface coil, said second current comprised of a second coil amplitude and a second coil phase.

19. A method as described in claim 18, further comprising:
adjusting said second coil amplitude and said first coil amplitude independently to reduce phase-shift in said imaging field.

20. A method as described in claim 17, further comprising:
using a controller with embedded logic to automatically make adjustments to said first coil current and said second coil current to reduce phase-shift in said imaging field.

* * * * *